United States Patent
O (10) Patent No.: US 12,075,138 B2
(45) Date of Patent: Aug. 27, 2024

(54) CAMERA FOR MEASURING DEPTH INFORMATION AND OPTICAL DEVICE INCLUDING SAME

(71) Applicant: LG INNOTEK CO., LTD., Seoul (KR)

(72) Inventor: Young Don O, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 1015 days.

(21) Appl. No.: 16/981,974

(22) PCT Filed: Mar. 18, 2019

(86) PCT No.: PCT/KR2019/003095
§ 371 (c)(1),
(2) Date: Sep. 17, 2020

(87) PCT Pub. No.: WO2019/182305
PCT Pub. Date: Sep. 26, 2019

(65) Prior Publication Data
US 2021/0099618 A1      Apr. 1, 2021

(30) Foreign Application Priority Data

Mar. 20, 2018  (KR) .................. 10-2018-0031913

(51) Int. Cl.
*H04N 23/00*       (2023.01)
*G02B 5/02*        (2006.01)
(Continued)

(52) U.S. Cl.
CPC .............. *H04N 23/00* (2023.01); *G02B 5/02* (2013.01); *H01L 25/0753* (2013.01); *H05K 1/18* (2013.01)

(58) Field of Classification Search
CPC ........ H01L 25/0753; G02B 5/02–0294; H04N 23/00–959
See application file for complete search history.

(56) References Cited

U.S. PATENT DOCUMENTS

2004/0132491 A1   7/2004  Kim et al.
2009/0135287 A1   5/2009  Yang
(Continued)

FOREIGN PATENT DOCUMENTS

CN    103428412 A    12/2013
CN    103534797 A     1/2014
(Continued)

OTHER PUBLICATIONS

Office Action dated Jan. 31, 2022 in Japanese Application No. 2020-550145.
(Continued)

*Primary Examiner* — Amar Movva
(74) *Attorney, Agent, or Firm* — Saliwanchik, Lloyd & Eisenschenk (57) ABSTRACT

An embodiment comprises: a substrate; a light emitting unit including a light emitting diode disposed on the substrate; a light receiving unit including a lens barrel and a sensor; a case housing the light emitting unit; a diffusing unit coupled to the case and disposed above the light emitting unit; a circuit substrate coupled to the substrate and the sensor; a first wire electrically connecting the light emitting unit and the substrate; and a second wire electrically connecting the substrate and the circuit substrate.

20 Claims, 6 Drawing Sheets

(51) Int. Cl.
*H01L 25/075* (2006.01)
*H05K 1/18* (2006.01)

(56) References Cited

U.S. PATENT DOCUMENTS

| | | | |
|---|---|---|---|
| 2010/0129069 A1 | 5/2010 | Chung et al. |
| 2015/0229912 A1 | 8/2015 | Masalkar et al. |
| 2017/0356982 A1 | 12/2017 | Buettgen et al. |
| 2018/0063509 A1 | 3/2018 | Koppal et al. |
| 2018/0100986 A1 | 4/2018 | Kim et al. |

FOREIGN PATENT DOCUMENTS

| | | | |
|---|---|---|---|
| CN | 105988262 A | 10/2016 |
| CN | 105992960 A | 10/2016 |
| JP | 7-159538 A | 6/1995 |
| JP | 10-214437 A | 8/1998 |
| JP | 2003-179093 A | 6/2003 |
| JP | 2004-71366 A | 3/2004 |
| JP | 2013-41931 A | 2/2013 |
| JP | 2014-17716 A | 1/2014 |
| JP | 2014-167387 A | 9/2014 |
| JP | 2014-183396 A | 9/2014 |
| JP | 2015-103911 A | 6/2015 |
| JP | 2015-206590 A | 11/2015 |
| JP | 2016-139731 A | 8/2016 |
| JP | 2016-534343 A | 11/2016 |
| KR | 10-2006-0032312 A | 4/2006 |
| KR | 10-2010-0092203 A | 8/2010 |
| KR | 10-2013-0086749 A | 8/2013 |
| KR | 10-2015-0042631 A | 4/2015 |
| KR | 10-1792439 B1 | 10/2017 |
| WO | WO-2017/157724 A1 | 9/2017 |

OTHER PUBLICATIONS

Office Action dated Feb. 28, 2023 in Japanese Application No. 2022-113218.
Office Action dated May 24, 2023 in Chinese Application No. 202211008327.4.
Office Action dated Nov. 8, 2021 in Chinese Application No. 201980020368.5.
Supplementary European Search Report dated Dec. 21, 2021 in European Application No. 19772457.8.
International Search Report in International Application No. PCT/KR2019/003095, filed Mar. 18, 2019.

CAMERA FOR MEASURING DEPTH INFORMATION AND OPTICAL DEVICE INCLUDING SAME

CROSS-REFERENCE TO RELATED APPLICATIONS

This application is the U.S. national stage application of International Patent Application No. PCT/KR2019/003095, filed Mar. 18, 2019, which claims the benefit under 35 U.S.C. § 119 of Korean Application No. 10-2018-0031913, filed Mar. 20, 2018, the disclosures of each of which are incorporated herein by reference in their entirety.

TECHNICAL FIELD

Embodiments relate to a camera module and an optical device.

BACKGROUND ART

There have been developed mobile phones or smartphones equipped with a camera module that captures and stores an image or a video of an object. In addition, with increasing interest in stereoscopic service, camera modules providing a stereoscopic image have recently been developed.

Methods of implementing a 3D stereoscopic image include a stereoscopic method, a time-of-flight (ToF) method, and a structured light method.

The time-of-flight (ToF) method acquires depth information of an object by directly radiating light onto the object and calculating the time taken for the light to return after being reflected from the object.

DISCLOSURE

Technical Problem

Embodiments include a camera module and an optical device including the same that are capable of facilitating a change in the design of a diffusion unit, inhibiting an increase in manufacturing costs attributable to the design change, inhibiting contamination or generation of foreign substances attributable to an SMT process, and inhibiting collision between a gripper of a wire-bonding apparatus and components to protect the components during wire bonding.

Technical Solution

A camera module according to an embodiment may include a light emitter including a substrate and a light-emitting diode disposed on the substrate, a light receiver including a lens barrel and a sensor, a case accommodating the light emitter, a diffusion unit coupled to the case and disposed on the light emitter, a printed circuit board coupled to the substrate and the sensor, a first wire electrically connecting the light emitter to the substrate, and a second wire electrically connecting the substrate to the printed circuit board.

The case may accommodate the light receiver.

The case may be coupled to the printed circuit board, and the diffusion unit may be spaced apart from the light emitter.

The substrate and the sensor may be attached to the upper surface of the printed circuit board.

The camera module may further include a stiffener disposed under the printed circuit board and coupled to the printed circuit board, and the printed circuit board may include therein a first opening in which the substrate is disposed.

The printed circuit board may include therein a second opening in which the sensor is disposed, and the sensor may be coupled to the stiffener.

The case may include a first case accommodating the light emitter and a second case accommodating the light receiver. The first case and the second case may be spaced apart from each other. The diffusion unit may be coupled to the first case. The printed circuit board may include a first printed circuit board, disposed under the first case, and a second printed circuit board, disposed under the second case and spaced apart from the first printed circuit board. The substrate may be disposed on the first printed circuit board, and the sensor may be disposed on the second printed circuit board.

The light emitter may include a sidewall disposed on the upper surface of the substrate and protruding from the substrate toward the diffusion unit, and the sidewall may have therein an opening that is open to one of sides of the upper surface of the substrate.

The sidewall may include a first sidewall disposed adjacent to a first short side of the substrate and a second sidewall disposed adjacent to a second short side of the substrate, which is located opposite the first short side. The opening in the sidewall may be open to a first long side of the substrate, which is located between the first short side and the second short side.

The height from the upper surface of the substrate to the upper end of the sidewall may be greater than the height to the upper surface of the light-emitting diode.

Advantageous Effects

Embodiments are capable of facilitating a change in the design of a diffusion unit, inhibiting an increase in manufacturing costs attributable to the design change, inhibiting contamination or generation of foreign substances attributable to an SMT process, and preventing inhibiting collision between a gripper of a wire-bonding apparatus and components to protect the components during wire bonding.

BEST MODE

Hereinafter, embodiments of the present disclosure, which may concretely realize the objects described above, will be described with reference to the accompanying drawings.

In the following description of the embodiments, it will be understood that, when each element is referred to as being "on" or "under" another element, it can be directly on or under the other element, or can be indirectly formed such that one or more intervening elements are also present. In addition, when an element is referred to as being "on or under", "under the element" as well as "on the element" may be included based on the element.

In addition, the relational terms "first", "second", "on/upper part/above", and "under/lower part/below" are used herein only to distinguish between one subject or element and another subject or element without necessarily requiring or involving any physical or logical relationship or sequence between such subjects or elements. Wherever possible, the same reference numerals will be used throughout the drawings to refer to the same parts.

Additionally, the terms "comprises", "includes", and "has" described herein should be interpreted not to exclude other elements but to further include such other elements, since the corresponding elements may be inherent unless mentioned otherwise. In addition, the term "corresponding to" herein may encompass at least one of the meanings of "facing" and "overlapping".

For convenience of description, the embodiments will be described using the Cartesian coordinate system (x, y, z), but the embodiments are not limited thereto, and may be described using other coordinate systems. In the respective drawings, the x-axis and the y-axis may be directions perpendicular to the z-axis, which is an optical-axis direction, the z-axis direction, which is the optical-axis direction or a direction parallel to the optical axis, may be referred to as a 'first direction', the x-axis direction may be referred to as a 'second direction', and the y-axis direction may be referred to as a 'third direction'.

A camera module 1000 according to an embodiment is a device capable of capturing a stereoscopic image using a time-of-flight (ToF) method, and may include a light transmitter configured to emit light to an object (or a target) and a light receiver configured to receive the light reflected from the object (or the target).

Figure 1:
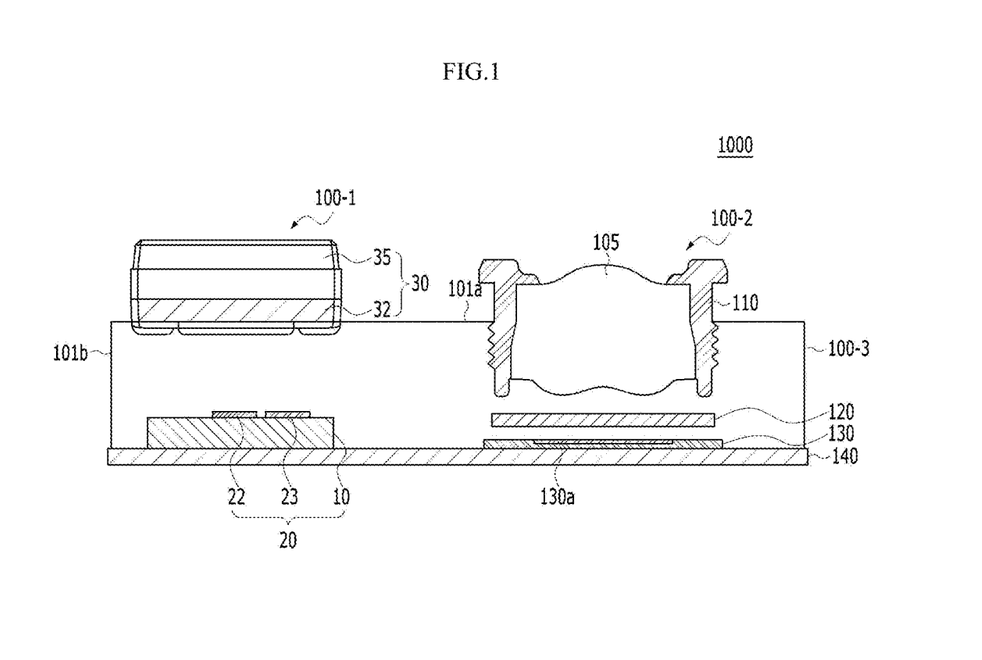
FIG. 1 is a cross-sectional view of a camera module according to an embodiment.
Figure 2:
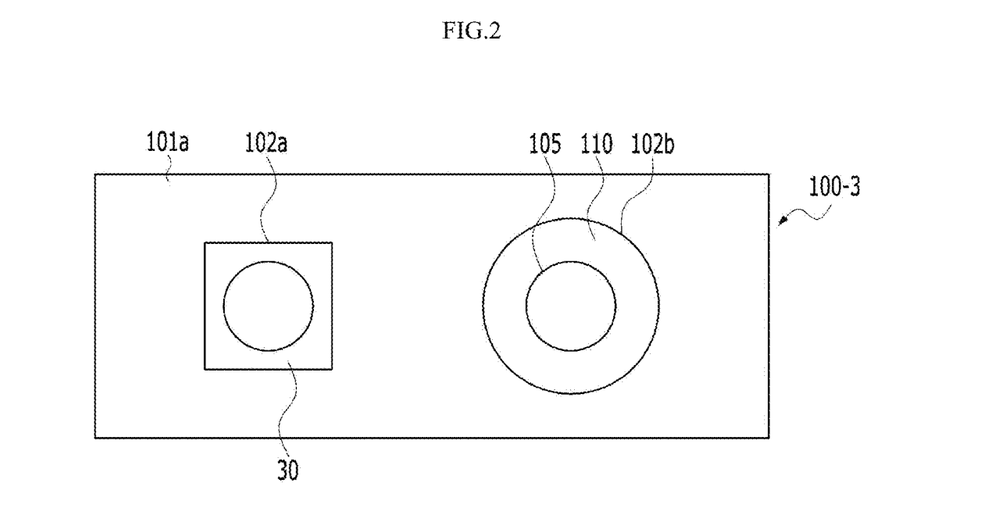
FIG. 2 is a plan view of the camera module of FIG. 1.

FIG. 1 is a cross-sectional view of the camera module 1000 according to an embodiment, and FIG. 2 is a plan view of the camera module 1000 of FIG. 1.

Referring to FIGS. 1 and 2, the camera module 1000 may include a light transmitter 100-1, a light receiver 100-2, and a case 100-3. Here, the case 100-3 may be referred to as a housing or a holder.

The light transmitter 100-1 radiates divergent light having a predetermined field of view to an object (or a target).

The light transmitter 100-1 may include a light emitter 20 and a diffusion unit 30.

The light emitter 20 may generate light. For example, the light emitter 20 may generate infrared light or laser light.

For example, the light emitter 20 may include a substrate 10 and a light-emitting diode 22 disposed on the substrate 10.

For example, the light-emitting diode 22 may generate light in an infrared ray (IR) range.

For example, the light-emitting diode 22 may be a laser diode.

For example, the light-emitting diode 22 may be a vertical cavity surface emitting laser (VCSEL).

For example, the light-emitting diode 22 may include a wafer and a plurality of light-emitting diodes disposed or arranged on the wafer. In this case, the light-emitting diodes may be arranged in a matrix form, without being limited thereto.

The light emitter 20 may further include a photodiode 23 configured to sense light generated from the light-emitting diode 22. The performance of the light-emitting diode 22, or whether the light-emitting diode 22 is operating normally, may be determined based on the intensity of light from the light-emitting diode 22 sensed by the photodiode 23.

For example, the camera module 1000 may further include a controller (not shown) configured to determine, based on the intensity of light from the light-emitting diode 22 sensed by the photodiode 23, the performance of the light-emitting diode 22 or whether the light-emitting diode 22 is operating normally.

The substrate 10 may be a substrate including metal for heat dissipation, for example, an aluminum or AlN substrate. The light-emitting diode 22 and the photodiode 23 may be attached to the substrate 10 using an adhesive member or a conductive adhesive (e.g. Ag epoxy).

The diffusion unit 30 is disposed on the light-emitting diode 22, and diffuses light radiated from the light-emitting diode 22. For example, the diffusion unit 30 may be a light diffusion unit.

The diffusion unit 30 may be spaced apart from the light emitter 20, and may be opposite or aligned with the light-emitting diode 22 in a vertical direction.

The diffusion unit 30 may convert or change the field of view of light radiated from the light emitter 20. That is, the diffusion unit 30 may change the light radiated from the light emitter 20 into divergent light forming a predetermined field of view.

The diffusion unit 30 may include a diffusion member 32 and a housing 35 for accommodating the diffusion member 32.

The diffusion member 32 may be made of a resin or plastic material including a light-diffusing agent and/or a light-scattering agent, without being limited thereto.

For example, the field of view of light radiated from the light emitter 20 may be 20 degrees to 40 degrees, and the field of view of light that has passed through the diffusion member 32 may be 60 degrees to 80 degrees.

The diffusion member 32 according to another embodiment may include at least one of a lens, a prism, a mirror, a diffuser, or a film. For example, the lens may be a zoom lens or a liquid lens. Here, the zoom lens may be moved in a forward-backward direction (or an upward-downward direction) on the axis of the divergent light, and the movement distance thereof may be adjusted to thereby change the field of view of the divergent light. In addition, the liquid lens may include two different types of liquids, which are disposed in a flat plate while forming an interface therebetween, and the curvature of the interface may change according to the magnitude of the driving voltage applied to both ends of the flat plate, with the result that the field of view of the divergent light may change.

For example, the diffusion member 32 may be disposed in the housing 35, and the housing 35 may be coupled to the top plate 101a of the case 100-3. For example, the housing 35 and the case 100-3 may have a coupling structure (e.g. male-female coupling) so as to be coupled to each other. For example, the coupling structure may be a protrusion or a groove, and the housing 35 may be fixed to or detachably mounted to the case 100-3.

In FIG. 1, the housing 35 is provided separately from the case 100-3 and is coupled thereto, without being limited thereto. In another embodiment, the housing 35 and the case 100-3 may be implemented in an integrated form. For example, the case may be formed to have a protruding portion that protrudes from the top plate thereof so as to accommodate the diffusion member 32.

For example, the diffusion member 32 may include a lens unit and an optical path changing unit, which are sequentially arranged. The lens unit of the diffusion member 32 may include a collimator lens, and may convert the divergent light emitted from the light-emitting diode 22 into parallel light.

In addition, the optical path changing unit of the diffusion member 32 may change the optical path of the parallel light that has passed through the lens unit of the diffusion member 32 so as to generate divergent light having a predetermined field of view. For example, the optical path changing unit of the diffusion member 32 may include at least one of a prism, a lens, or a mirror.

The above description of the diffusion member 32 is merely given by way of example, and the diffusion member 32 may be implemented in various forms in order to radiate divergent light having a predetermined field of view onto an object.

The housing 35 may include an opening formed therein to radiate light emitted from the diffusion member 32, and the diffusion unit 30 may further include a piece of glass mounted to the opening in the housing 35.

The light receiver 100-2 may receive light reflected from an object (or a target). Here, the reflected light may include light that originates from the light transmitter 100-1 and returns to the light receiver 100-2 via the target and light that originates from the sun or any other light source and enters the light receiver 100-2 via the target.

The light receiver 100-2 may include a lens 105, a lens barrel 110 in which the lens 105 is mounted, a filter 120, and a sensor 130.

The sensor 130 may be disposed below the lens 105, and may be an image sensor capable of converting light incident through the lens 105 into an electrical signal.

For example, the sensor 130 may be implemented as a charge-coupled device or a complementary metal oxide semiconductor (CMOS).

Further, for example, the sensor 130 may be an IR sensor or a time-of-flight (ToF) sensor.

The sensor 130 may include an effective area 130a for sensing the light that has passed through the lens 105. For example, the effective area 130a may be referred to as a light-receiving area, an active area, or a photographing area, and the center of the effective area 130a may correspond to or be aligned with the optical axis of the lens 105.

The filter 120 may be disposed between the lens 105 and/or the lens barrel 110 and the sensor 130, and may serve to block light in a specific frequency band from entering the sensor 130 among the light passing through the lens.

For example, when the sensor 130 is an IR sensor, the filter 120 may be an IR pass filter, without being limited thereto. In another embodiment, the filter 120 may be an IR cutoff filter.

The case 100-3 accommodates the light transmitter 100-1 and the light receiver 100-2 therein.

For example, the case 100-3 may be formed in the shape of a box that has an open bottom and includes a top plate 101a and side plates 101b, without being limited thereto.

For example, the planar shape of the top plate 101a of the case 100-3 may be a polygon, such as a rectangle or an octagon, without being limited thereto.

The top plate 101a of the case 100-3 may include therein a first opening 102a corresponding to the housing 35 of the diffusion unit 30 and a second opening 102b corresponding to the lens barrel 110 or the lens 105.

For example, each of the first opening 102a and the second opening 102b may have a rectangular shape or a circular shape.

The housing 35 of the diffusion unit 30 may be coupled to the top plate 101a of the case 100-3.

For example, the housing 35 of the diffusion unit 30 may be coupled to the first opening 102a in the top plate 101a of the case 100-3, without being limited thereto.

The housing 35 of the diffusion unit 30 may protrude in a forward or upward direction from the upper surface of the top plate 101a of the case 100-3. Here, the forward or upward direction may be a direction oriented from the light emitter 20 to the diffusion unit 30.

The lens barrel 110 may be coupled to the top plate 101a of the case 100-3.

For example, the lens barrel 110 may be disposed inside the second opening 102b in the top plate 101a of the case 100-3.

The lens barrel 110 and/or the lens 105 may protrude in the forward or upward direction from the upper surface of the top plate 101a of the case 100-3.

The camera module 1000 may further include a printed circuit board 140, which is disposed below the light-emitting diode 22 of the light emitter 20 and the lens barrel 110 and/or the lens 105 of the light receiver 100-2.

For example, the printed circuit board 140 may be disposed under the substrate 10 of the light emitter 20 and the sensor 130. For example, the substrate 10 and the sensor 130 may be attached to the upper surface of the printed circuit board 140 using an adhesive member.

The substrate 10 may be disposed in one region of the upper surface of the printed circuit board 140, and the sensor 130 may be disposed in another region of the upper surface of the printed circuit board 140.

Figure 3:
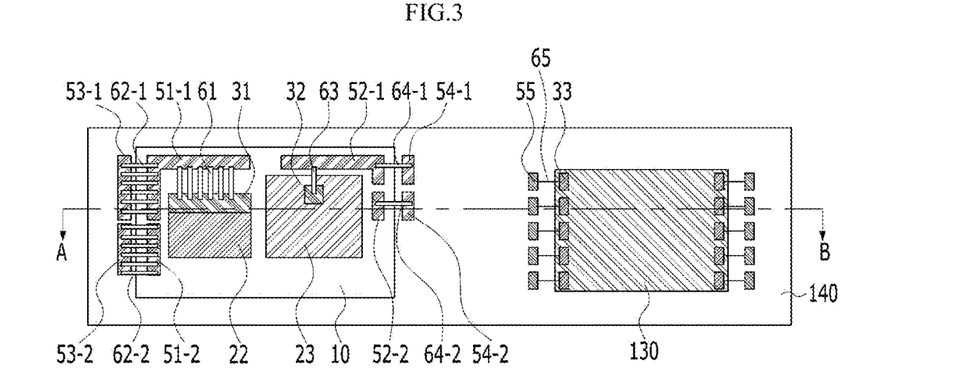
FIG. 3 is a plan view of the printed circuit board, the light emitter, and the sensor of FIG. 1.
Figure 4:
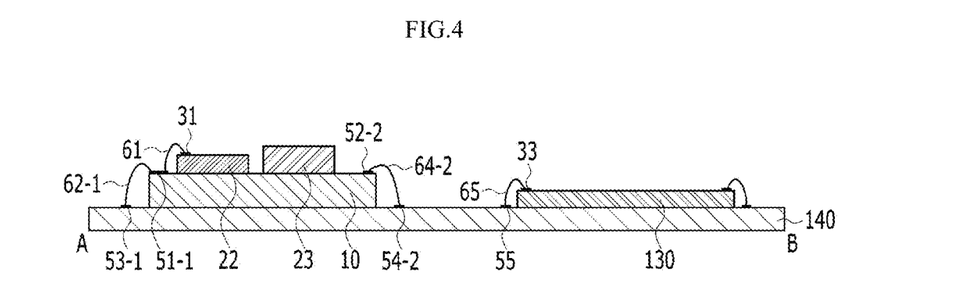
FIG. 4 is a cross-sectional view of the printed circuit board, the light emitter, and the sensor shown in FIG. 3 when viewed in the direction AB.

FIG. 3 is a plan view of the printed circuit board 140, the light emitter 20, and the sensor 130 of FIG. 1, and FIG. 4 is a cross-sectional view of the printed circuit board 140, the light emitter 20, and the sensor 130 shown in FIG. 3 when viewed in the direction AB. A wire 61 is not illustrated in FIG. 4, which is a cross-sectional view taken in the direction AB of FIG. 3, and the light-emitting diode 22 is schematically illustrated in FIG. 4 in order to show the electrical connection between a first electrode 31 and a first terminal of the substrate 10.

Referring to FIGS. 3 and 4, the light-emitting diode 22 may include a first electrode 31 and a second electrode (not shown). The photodiode 23 may include a first electrode 32 and a second electrode (not shown).

The substrate 10 may include first and second terminals 51-1 and 51-2 and third and fourth terminals 52-1 and 52-2.

The printed circuit board 140 may include first and second terminals 53-1 and 53-2 and third and fourth terminals 54-1 and 54-2.

The light emitter 20 may further include a wire 61 connecting the first electrode 31 of the light-emitting diode 22 to the first terminal 51-1 of the substrate 10 and a wire 62-1 connecting the first terminal 51-1 of the substrate 10 to the first terminal 53-1 of the printed circuit board 140.

In addition, the second electrode (not shown) of the light-emitting diode 22 may be electrically connected to the second terminal 51-2 of the substrate 10.

For example, the second electrode of the light-emitting diode 22 may be disposed on the lower surface of the light-emitting diode 22, a part of the second terminal 51-2 of the substrate 10 may be disposed under the second electrode of the light-emitting diode 22, and the second electrode of the light-emitting diode 22 and a part of the second terminal 51-2 of the substrate 10 may be electrically connected to each other using a conductive adhesive member.

The light emitter 20 may further include a wire 62-2 connecting the second terminal 51-2 of the substrate 10 to the second terminal 53-2 of the printed circuit board 140. Accordingly, the light-emitting diode 22 may be electrically connected to the first and second terminals 53-1 and 53-2 of the printed circuit board 140.

Here, in the substrate 10 or the printed circuit board 140, the term "terminal" may be replaced with "conductive layer", "pad", or "electrode". In addition, in the light-emitting diode 22 or the photodiode 23, the term "electrode" may be replaced with "pad" or "conductive layer".

In addition, the light emitter 20 may further include a wire 63 connecting the first electrode 32 of the photodiode 23 to the third terminal 52-1 of the substrate 10 and a wire 64-1 connecting the third terminal 52-1 of the substrate 10 to the third terminal 54-1 of the printed circuit board 140.

The second electrode (not shown) of the photodiode 23 may be electrically connected to the fourth terminal 52-2 of the substrate 10. For example, the second electrode of the photodiode 23 may be located on the lower surface of the photodiode, a part of the fourth terminal 52-2 of the substrate 10 may be located under the second electrode of the photodiode 1223, and a part of the fourth terminal 52-2 of the substrate 10 may be electrically connected to the second electrode of the photodiode 23 using a conductive adhesive member.

The light emitter 20 may further include a wire 64-2 connecting the fourth terminal 52-2 of the substrate 10 to the fourth terminal 54-2 of the printed circuit board 140.

For example, the substrate 10 may have a rectangular shape, and the upper surface of the substrate 10 may include four sides. For example, the upper surface of the substrate 10 may have two long sides facing each other and two short sides facing each other.

For example, the first terminal 51-1 of the substrate 10 may be disposed adjacent to the first long side of the upper surface of the substrate 10 and the first short side adjacent to the first long side, and may have an inverted L-shape, without being limited thereto.

In addition, for example, the second terminal 51-2 of the substrate 10 may be disposed adjacent to the first short side of the substrate 10, and may be positioned between the first terminal and the second long side of the substrate 10. The second long side of the substrate 10 may be the side that faces or is located opposite the first long side of the substrate 10.

For example, the first and second terminals 53-1 and 53-2 of the printed circuit board 140 may be disposed adjacent to the first short side of the upper surface of the printed circuit board 140, which corresponds to the first short side of the substrate 10.

For example, the third terminal 52-1 of the substrate 10 may be disposed adjacent to the first long side of the substrate 10 and the second short side adjacent to the first long side. The third terminal 52-1 may be formed to bend from the first long side to the second short side of the substrate 10.

For example, the fourth terminal 52-2 of the substrate 10 may be disposed adjacent to the second short side of the substrate 10.

The third terminal 54-1 and the fourth terminal 54-2 of the printed circuit board 140 may be disposed in the region of the upper surface of the printed circuit board 140 that is adjacent to the second short side of the substrate 10.

The sensor 130 may include at least one electrode 33, and the printed circuit board 140 may further include a fifth terminal 55 to be electrically connected to the sensor 130.

The light receiver 100-2 may further include a wire 65 connecting the electrode 33 of the sensor 130 to the fifth terminal 55 of the printed circuit board 140.

The thickness of the substrate 10 may be greater than the thickness of the sensor 130. The reason for this is that, since the light emitter 22 and the photodiode 23 are mounted on the substrate 10 and a wire-bonding process is performed on the substrate 10, the substrate 10 needs to exhibit durability or strength capable of withstanding this process.

Although not shown in FIG. 3, the camera module 1000 may further include a stiffener disposed under the printed circuit board 140. In this case, the stiffener functions to support the printed circuit board 140 or to enhance the strength of the printed circuit board 140, and may be made of a metal material such as SUS. In addition, the stiffener may perform a heat dissipation function for dissipating the heat generated from the light source module and/or the sensor.

Figure 5:
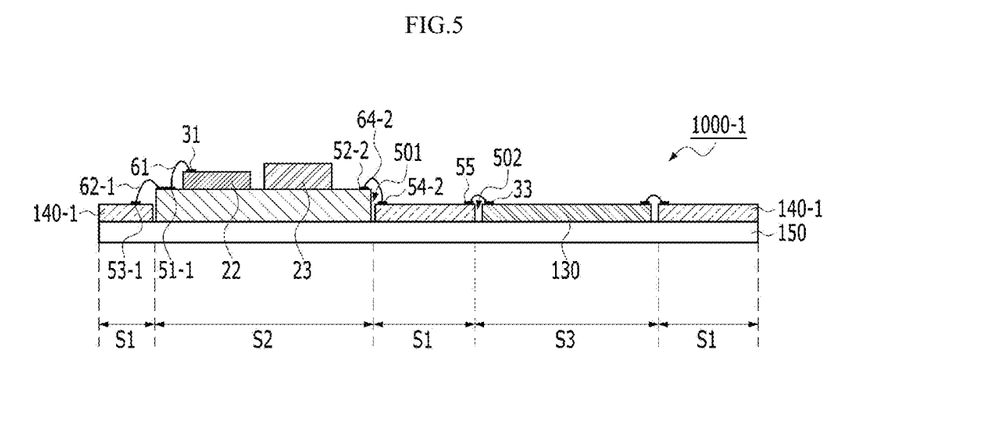
FIG. 5 is a partial cross-sectional view of a camera module including a printed circuit board and a stiffener according to another embodiment.

FIG. 5 is a partial cross-sectional view of a camera module 1000-1 including a printed circuit board 140-1 and a stiffener 150 according to another embodiment. The camera module 1000-1 may include the diffusion unit 30, the lens 105, the lens barrel 110, the filter 120, and the case 100-3 of FIG. 1, to which the description made with reference to FIGS. 1 to 4 may apply.

Referring to FIG. 5, the camera module 1000-1 may include a stiffener 150 disposed under the printed circuit board 140.

The printed circuit board 140-1 may include therein a first opening 501 corresponding to the substrate 10 and a second opening 502 corresponding to the sensor 130.

Each of the first opening 501 and the second opening 502 may be a through-hole penetrating the printed circuit board 140-1.

The first opening 501 may have a shape corresponding to the substrate 10, for example, a rectangular shape, and the second opening 502 may have a shape corresponding to the sensor 130, for example, a rectangular shape.

For example, the area of the first opening 501 defined by the length thereof in the horizontal direction and the length thereof in the vertical direction may be greater than the area of the substrate 10 defined by the length thereof in the horizontal direction and the length thereof in the vertical direction (e.g. the area of the lower surface of the substrate 10).

In addition, the area of the second opening 502 defined by the length thereof in the horizontal direction and the length thereof in the vertical direction may be greater than the area of the sensor 130 defined by the length thereof in the horizontal direction and the length thereof in the vertical direction (e.g. the area of the lower surface of the sensor).

The stiffener 150 may include a first region S1, in which the printed circuit board 140-1 is disposed, a second region S2 corresponding to the first opening 501 in the printed circuit board 140-1, and a third region S3 corresponding to the second opening 502.

The printed circuit board 140-1 may be attached or fixed to the upper surface of the stiffener 150, for example, the first region S1, using an adhesive member (not shown).

The substrate 10 is disposed in the second region S2 of the stiffener 150. For example, the substrate 10 may be attached or fixed to the second region S2 of the stiffener 150 using an adhesive member (not shown).

The sensor 130 is disposed in the third region S3 of the stiffener 150. For example, the sensor 130 may be attached or fixed to the third region S3 of the stiffener 150 using an adhesive member (not shown).

Since the substrate 10 is disposed inside the first opening 501 in the printed circuit board 140-1 and the sensor 130 is disposed inside the second opening 502 in the printed circuit board 140-1, it is possible to reduce the height from the lower surface of the stiffener 150 to the upper surface of the light source module and/or the sensor, whereby the embodiment is capable of reducing the height of the camera module 1000-1.

In addition, since the substrate 10 is disposed inside the first opening 501 in the printed circuit board 140-1 and the sensor 130 is disposed inside the second opening 502 in the printed circuit board 140-1, it is possible to reduce the height difference between the upper surface of the substrate 10 and the upper surface of the printed circuit board 140-1 in the vertical direction and to reduce the height difference between the upper surface of the printed circuit board 140-1 and the sensor 130 in the vertical direction, whereby the embodiment is capable of enhancing the reliability of connection or bonding of the wires 62-1, 62-2, 64-1 and 64-2 between the substrate 10 and the printed circuit board 140-1 and enhancing the reliability of connection or bonding of the wire 65 between the sensor 130 and the printed circuit board 140-1.

Figure 6:
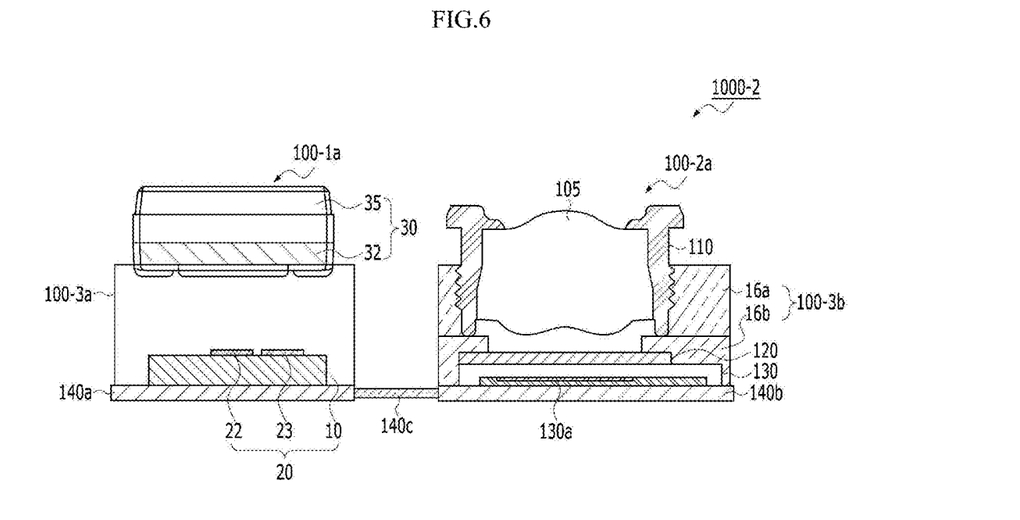
FIG. 6 is a cross-sectional view of a camera module according to another embodiment.

FIG. 6 is a cross-sectional view of a camera module 1000-2 according to another embodiment.

Referring to FIG. 6, the camera module 1000-2 may include a light transmitter 100-1a, a light receiver 100-2a, and a connection substrate 140c. The same reference numerals as those in FIG. 1 denote the same components, and a description of the same components will be omitted or made briefly.

While the light transmitter 100-1 and the light receiver 100-2 of FIG. 1 are mounted on one printed circuit board 140 and are accommodated in one case, the light transmitter 100-1a of FIG. 6 may be disposed or mounted on a first printed circuit board 140a, and the light receiver 100-2a of FIG. 6 may be disposed or mounted on a second printed circuit board 140b.

The printed circuit board 140 of FIG. 1 may be divided into the first printed circuit board 140a and the second printed circuit board 140b of FIG. 6, and the case 100-3 of FIG. 1 may be divided into the first case 100-3a and the second case 100-3b of FIG. 6.

For example, the first case 100-3a may have therein a first opening 102a, and may accommodate the light emitter 20. The second case 100-3b may be spaced apart from the first case, may have therein a second opening 102b, and may accommodate a lens barrel 110 and a sensor 130.

For example, a diffusion unit 30 may be coupled to the first case 100-3a.

The first printed circuit board 140a may be disposed under the first case 100-3a, and the second printed circuit board 140b may be spaced apart from the first printed circuit board 140a, and may be disposed under the second case 100-3b.

The substrate 10 may be disposed on the first printed circuit board 140a, and the sensor 130 may be disposed on the second printed circuit board 140b.

The light transmitter 100-1a may include a light emitter 20, a first printed circuit board 140a, a first case 100-3a, and a diffusion unit 30.

The light emitter 20 may be disposed on the first printed circuit board 140a, and the diffusion unit 30 may be disposed in the first case 100-3a, and may be coupled to the first case 100-3a.

The first case 100-3a may have therein a first opening corresponding to the diffusion unit 30.

The description of the first opening 102a of FIG. 2 may apply to the first opening in the first case 100-3a. The description of the electrical connection relationships between the printed circuit board 140, the substrate 10, the light-emitting diode 22, and the photodiode 23 of FIGS. 3 and 4 may apply to the first printed circuit board 140a.

The light receiver 100-2a may include a lens 105, a lens barrel 110, a filter 120, a sensor 130, a second printed circuit board 140b, and a second case 100-3b.

The sensor 130 may be disposed on the second printed circuit board 140b, and the lens barrel 110 may be disposed in the second case 100-3b, and may be coupled to the second case 100-3b.

The second case 100-3 may have therein a second opening corresponding to the lens barrel 110. The description of the second opening 102b of FIG. 2 may apply to the second opening in the second case 100-3b. The description of the electrical connection relationship between the printed circuit board 140 and the sensor 130 of FIGS. 3 and 4 may apply to the second printed circuit board 140b.

For example, the second case 100-3b may include therein a second opening, and may include a first holder 16a coupled to the lens barrel 110 and a second holder 16b disposed under the first holder 16a and configured to allow a filter to be mounted thereto.

The lower end of the first holder 16a may be supported by the upper surface of the second holder 16b.

The second holder 16b may be disposed on the second printed circuit board 140b, and may be provided in the lower surface thereof with a seating groove corresponding to the sensor 130.

In FIG. 6, the first holder 16a and the second holder 16b are provided separately from each other, without being limited thereto. In another embodiment, the first holder 16a and the second holder 16b may be integrated to form a single holder.

The connection substrate 140c connects the first printed circuit board 140a and the second printed circuit board 140b to each other. For example, the connection substrate 140c may electrically connect the first printed circuit board 140a and the second printed circuit board 140b to each other.

For example, each of the first printed circuit board 140a and the second printed circuit board 140b may include at least one of a flexible PCB or a rigid PCB. The connection substrate 140c may be formed as a flexible PCB or a rigid-flexible PCB.

In the camera module according to another embodiment, the first printed circuit board 140a may have therein the first opening 501 of FIG. 5, and the second printed circuit board 140b may have therein the second opening 502 of FIG. 5, and may further include a first stiffener (not shown) disposed under the first printed circuit board 140a and a second stiffener disposed under the second printed circuit board 140b.

The description of the printed circuit board 140-1 and the substrate 10 disposed on the stiffener 150 of FIG. 5 may apply to the first printed circuit board 140a and the stiffener according to another embodiment, and the description of the printed circuit board 140-1 and the sensor 130 disposed on the stiffener 150 of FIG. 5 may apply to the second printed circuit board 140b and the stiffener according to another embodiment.

Further, in another embodiment, the first printed circuit board 140a, the second printed circuit board 140b, and the connection substrate 140c may be integrated to form a single substrate.

The camera module 1000 shown in FIG. 1 may be assembled in the following order.

First, a chip-on-board (COB)-type light emitter 20 and a sensor 130 are prepared.

Here, the COB type refers to a structure in which a light-emitting diode (e.g. 22) and/or a photodiode 23 is disposed or mounted on a substrate 10.

For example, the light-emitting diode 22 and/or the photodiode 23 may be mounted or bonded to the substrate 10 using an insulating adhesive member or a conductive adhesive member (e.g. Ag epoxy).

Subsequently, the light emitter 20 and the sensor 130 are mounted on a printed circuit board 140.

For example, the light emitter 20 and the sensor 130 may be attached or fixed to the printed circuit board 140 using an insulating adhesive member or a conductive adhesive member.

Subsequently, wire bonding between the substrate 10 and the light-emitting diode 22, wire bonding between the substrate 10 and the printed circuit board 140, and wire bonding between the sensor 130 and the printed circuit board 140 are performed through soldering or surface mounter technology (SMT).

Subsequently, a case 100-3, to which a lens 105, a diffusion unit 30, and a filter 120 are coupled, is attached to the printed circuit board 140.

For example, the lower portions or lower ends of the side plates of the case 100-3 may be coupled to the upper surface and/or the side surfaces of the printed circuit board 140.

The top plate 101a of the case 100-3 may be located at a higher position than the upper surface of the light-emitting diode 22 and the upper surface of the photodiode 23, which are disposed on the substrate 10. The diffusion unit 30 may be disposed so as to be spaced apart from the light-emitting diode 22.

In general, a light source of a ToF-type camera module may be of a package type in which a light-emitting diode and a diffusion unit are packaged. In such a package-type light source in which the light-emitting diode and the diffusion unit are bonded to each other, the light-emitting diode and the diffusion unit are supplied in a packaged form. Therefore, upon change in field of illuminator (FOI), there may occur problems in which the package needs to be newly designed, the manufacturing costs thereof are therefore increased, previously manufactured packages remain unused, and delivery is delayed.

In such a package type, the light-emitting diode and the diffusion unit are bonded to each other using an adhesive member, and an air vent hole may be formed in the adhesive member in order to discharge gas generated in the process of mounting the package-type light-emitting diode to the substrate through SMT. In a cleaning process performed after the package-type light source is soldered, a cleaning liquid may enter the air vent hole, thereby contaminating the light-emitting diode.

The light-emitting diode 22 and the photodiode 23 are attached to the substrate 10, and the substrate 10 is attached to the printed circuit board using an adhesive, for example, epoxy, rather than SMT. Electrical connection between the light-emitting diode 22 and the substrate 10 and electrical connection between the substrate 10 and the printed circuit board 140 are realized through wire bonding. Thus, in the camera module according to the embodiment, the design of the light transmitter 100-1 may be facilitated and simplified.

In addition, the diffusion unit 30 is coupled to the case 100-3, rather than being attached to the light emitter 20. Thus, in the embodiment, according to a change in field of illuminator (FOI) or a client request, only the diffusion unit 30 is changed in design and is mounted to the case 100-3, thereby inhibiting an increase in manufacturing costs attributable to the design change and inhibiting the occurrence of accumulated unused product and delayed delivery.

In addition, after electrical connection between the light-emitting diode 22 and the substrate 10 and electrical connection between the substrate 10 and the printed circuit board 140 are implemented through wire bonding, the housing 35 having the diffusion unit 30 coupled thereto is coupled to the printed circuit board 140 in a clean room. Thus, the embodiment is capable of inhibiting contamination or generation of foreign substances, which may be caused by an SMT process, thus inhibiting a defect of the camera module due to foreign substances.

Figure 7:
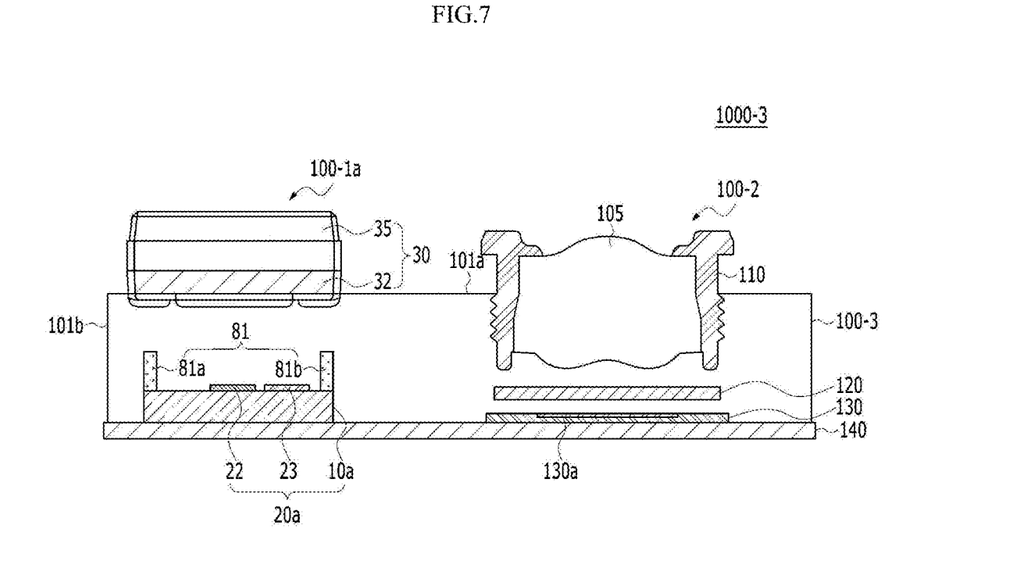
FIG. 7 is a cross-sectional view of a camera module according to still another embodiment.
Figure 8:
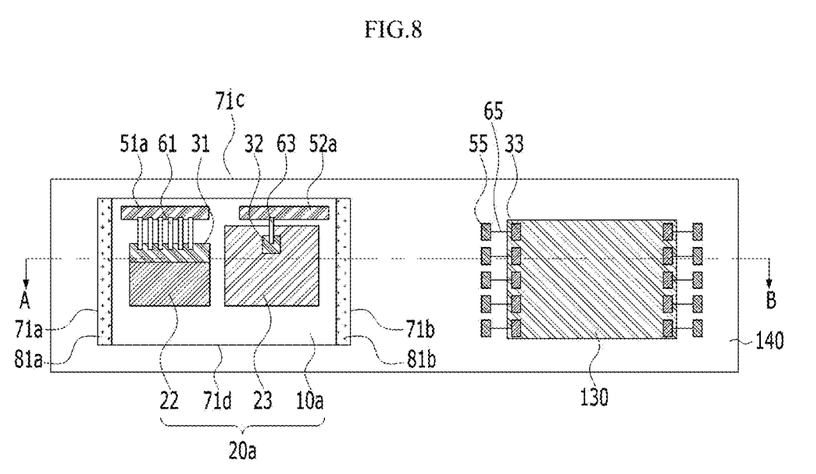
FIG. 8 is a plan view of the printed circuit board, the substrate, the light emitter, the photodiode, and the sensor of FIG. 7.
Figure 9:
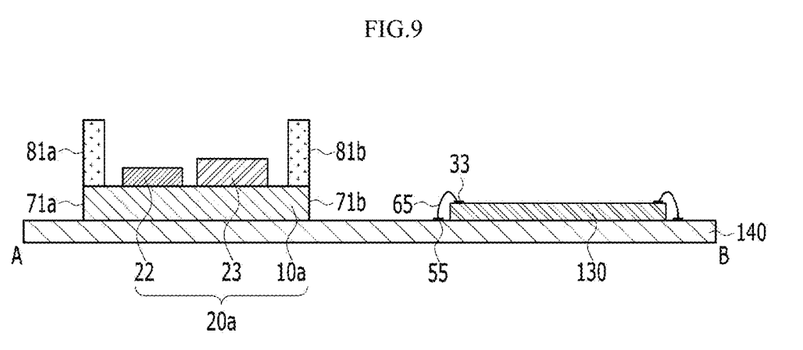
FIG. 9 is a cross-sectional view of the printed circuit board, the substrate, the light emitter, the photodiode, and the sensor shown in FIG. 8 when viewed in the direction AB.

FIG. 7 is a cross-sectional view of a camera module 1000-3 according to still another embodiment, FIG. 8 is a plan view of the printed circuit board 140, the light emitter 20a, and the sensor 130 of FIG. 7, and FIG. 9 is a cross-sectional view of the printed circuit board 140, the light emitter 20a, and the sensor 130 shown in FIG. 8 when viewed in the direction AB.

In FIGS. 7 to 9, the same reference numerals as those in FIGS. 1, 3 and 4 denote the same components, and a description of the same components will be made briefly or omitted.

Referring to FIGS. 7 to 9, the camera module 1000-3 may include a light transmitter 100-1a a, a light receiver 100-2, and a case 100-3.

The light transmitter 100-1a may include a light emitter 20a and a diffusion unit 30.

For example, the light emitter 20a may include a substrate 10a and a light-emitting diode 22 disposed on the substrate 10a.

The light emitter 20a may be of a type that is mounted on the printed circuit board 140 through an SMT process.

The substrate 10a may be a substrate including metal for heat dissipation, for example, an aluminum or AN substrate. The light-emitting diode 22 and a photodiode 23 may be attached to the substrate 10 using an adhesive member or a conductive adhesive (e.g. Ag epoxy).

The substrate 10a may include a first terminal 51a to be connected to a first electrode 31 of the light-emitting diode 22, a second terminal (not shown) to be connected to a second electrode (not shown) of the light-emitting diode 22, a third terminal 52a to be connected to a first electrode 32 of the photodiode 23, and a fourth terminal (not shown) to be connected to a second electrode (not shown) of the photodiode 23.

For example, the first electrode 31 of the light-emitting diode 22 and the first terminal 51a of the substrate 10a may be electrically connected to each other via a wire 61, and the second electrode of the light-emitting diode 22 and the second terminal of the substrate 10*a* may be electrically connected to each other using a conductive adhesive member (e.g. Ag epoxy).

In addition, for example, the first electrode 32 of the photodiode 23 and the third terminal 52*a* of the substrate 10*a* may be electrically connected to each other via a wire 63, and the second electrode of the photodiode 23 and the fourth terminal of the substrate 10*a* may be electrically connected to each other using a conductive adhesive member (e.g. Ag epoxy).

For example, the substrate 10*a* may include a first conductive layer and a second conductive layer, which are disposed on the lower surface of the substrate 10*a*, and may include a first connection electrode (not shown) for electrically connecting the first conductive layer to the second electrode (not shown) of the light-emitting diode 22 and a second connection electrode (not shown) for electrically connecting the second conductive layer to the second electrode of the photodiode 23.

For example, the first connection electrode may electrically connect the second terminal of the substrate 10*a* to the first conductive layer, and the second connection electrode may electrically connect the fourth terminal of the substrate 10*a* to the second conductive layer. In this case, each of the first and second connection electrodes may be a via penetrating the substrate 10*a* or a contact via, without being limited thereto, and may be formed on the surface of the substrate 10*a* (at least one of the upper surface, the side surface, or the lower surface thereof).

The light emitter 20*a* may be mounted on the printed circuit board 140 through an SMT process.

For example, the conductive layer of the substrate 10*a* of the light emitter 20*a* may be bonded to the printed circuit board 140 through an SMT process. In addition, after the SMT process, the printed circuit board 140 is cleaned, and the sensor 130 is attached to the printed circuit board 140.

Subsequently, wire bonding between the substrate 10*a* and the light-emitting diode 22, wire bonding between the substrate 10*a* and the printed circuit board 140, and wire bonding between the sensor 130 and the printed circuit board 140 are performed through soldering or surface mounter technology (SMT).

Subsequently, the case 100-3, to which a lens 105, a diffusion unit 30, and a filter 120 are coupled, is attached to the printed circuit board 140.

For example, the lower portions or lower ends of the side plates of the case 100-3 may be coupled to the upper surface and/or the side surfaces of the printed circuit board 140.

The light emitter 20*a* may include a sidewall 81 disposed on the upper surface of the substrate 10*a*.

The sidewall 81 may have a shape protruding from the upper surface of the substrate 10*a* in the optical-axis direction or the vertical direction. For example, the sidewall 81 may protrude or extend from the substrate 10*a* toward the diffusion unit 30.

When the light emitter 20*a*, the sensor 130, and/or the printed circuit board 140 is gripped by a gripper of a wire-bonding apparatus during wire bonding, the sidewall 81 may inhibit spatial interference between the gripper and the components 22, 23 and 130, thereby inhibiting the components 22, 23 and 130 from being damaged by the gripper.

In order to enable wire bonding, the sidewall 81 may include therein an opening that is open to one of the sides 71*a* to 71*d* of the upper surface of the substrate 10*a*.

For example, as shown in FIG. 8, the sidewall 81 may include a first sidewall 10*a* disposed adjacent to the first short side 71*a* of the substrate 10*a* and a second sidewall 10*b* disposed adjacent to the second short side 71*b* of the substrate 10*a*. The second short side 71*b* may be a side that faces or is located opposite the first short side 71*a*.

The opening in the sidewall 81 may be open to the first long side 71*c* of the substrate 10*a*, which is positioned between the first short side 71*a* and the second short side 71*b*.

For example, the sidewall 81 may include therein a first opening that is open to the first long side 71*c* of the substrate 10*a* and a second opening that is open to the second long side 71*d* of the substrate 10*a*.

For example, the sidewall 81 may not overlap the terminals 51*a* and 52*a* of the substrate 10*a* in the direction from the first long side 71*c* to the second long side 71*d* of the substrate 10*a*. That is, the sidewall may not be formed along the first long side 71*c* of the substrate 10*a* in order to facilitate wire bonding between the terminals 51*a* and 52*a* of the substrate 10*a* and the components 22 and 23.

The height H from the upper surface of the substrate 10*a* to the upper end of the at least one sidewall 10*a* or 10*b* may be greater than the height to the upper surface of the light-emitting diode 22 and the height to the upper surface of the photodiode 23. The reason for this is to protect the components 22 and 23 from the gripper of the wire-bonding apparatus.

Alternatively, for example, the height H may be greater than the height to the highest point of the wire 61 formed between the light-emitting diode 22 and the terminal 51*a* of the substrate 10*a* and the height to the highest point of the wire 63 formed between the photodiode 23 and the terminal 52*a* of the substrate 10*a*.

In another embodiment, the sidewall 81 may further include a third sidewall (not shown) disposed adjacent to one of the first long side 71*c* and the second long side 71*d* of the substrate 10*a*. The height of the third sidewall may be the same as the heights of the first and second sidewalls.

The sidewall 81 may be made of the same material as the substrate 10*a*, and may be integrally formed with the substrate 10*a*, without being limited thereto. In another embodiment, the sidewall 81 may be made of a material different from that of the substrate 10*a*, and may be attached to the substrate 10*a* using an adhesive member or the like, without being limited thereto.

Figure 10:
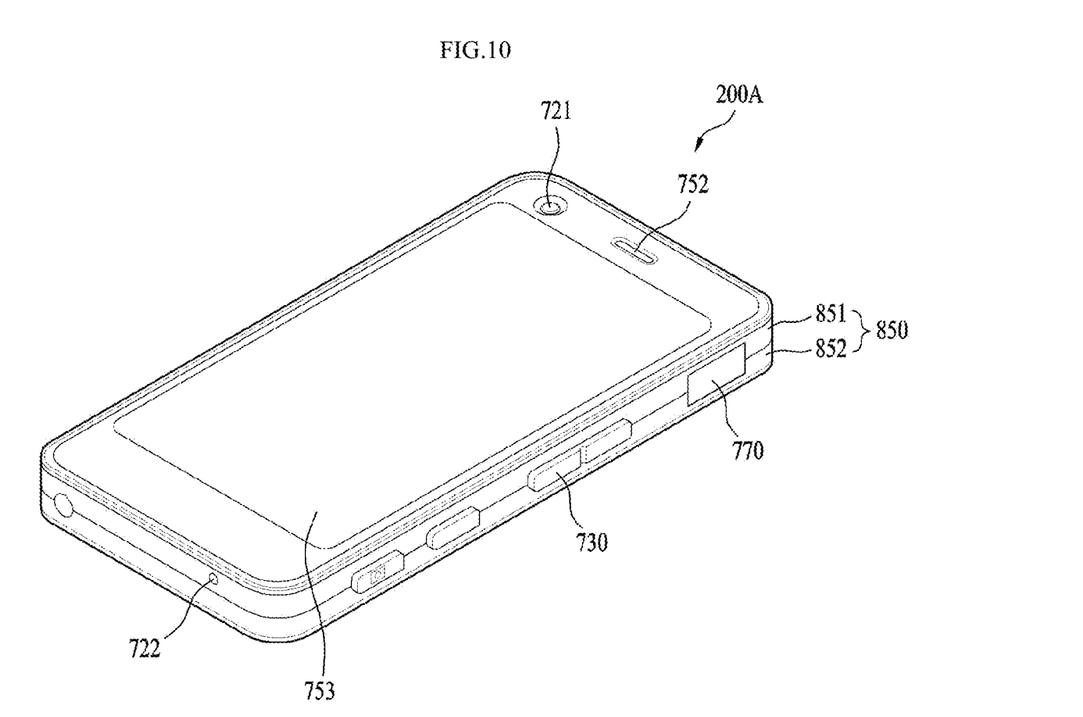
FIG. 10 is a perspective view of a portable terminal according to an embodiment.
Figure 11:
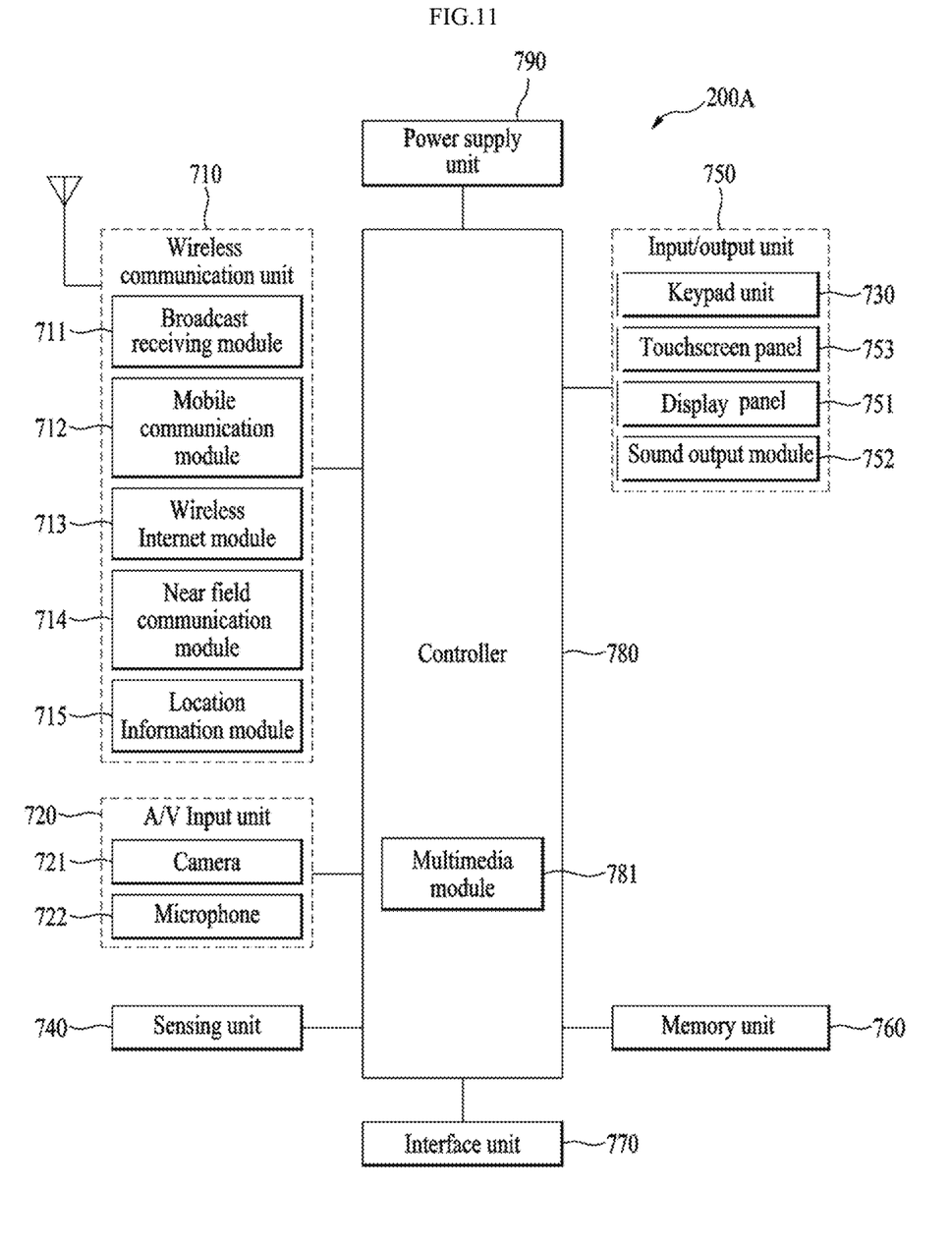
FIG. 11 is a configuration diagram of the portable terminal shown in FIG. 10.

FIG. 10 is a perspective view of a portable terminal 200A according to an embodiment, and FIG. 11 is a configuration diagram of the portable terminal 200A shown in FIG. 10.

Referring to FIGS. 10 and 11, the portable terminal 200A (hereinafter referred to as a "terminal") may include a body 850, a wireless communication unit 710, an A/V input unit 720, a sensor 740, an input/output unit 750, a memory 760, an interface 770, a controller 780, and a power supply 790.

The body 850 shown in FIG. 10 has a bar shape, without being limited thereto, and may be any of various types such as, for example, a slide type, a folder type, a swing type, or a swivel type, in which two or more sub-bodies are coupled so as to be movable relative to each other.

The body 850 may include a case (e.g. casing, housing, or cover) defining the external appearance thereof. For example, the body 850 may be divided into a front case 851 and a rear case 852. A variety of electronic components of the terminal may be mounted in the space formed between the front case 851 and the rear case 852.

The wireless communication unit 710 may include one or more modules, which enable wireless communication between the terminal 200A and a wireless communication system or between the terminal 200A and a network in which the terminal 200A is located. For example, the wireless communication unit 710 may include a broadcast receiving module 711, a mobile communication module 712, a wireless Internet module 713, a nearfield communication module 714, and a location information module 715.

The audio/video (A/V) input unit 720 serves to input audio signals or video signals, and may include a camera 721 and a microphone 722.

The camera 721 may include the camera module 1000, 1000-1, 1000-2 or 1000-3 according to the embodiment shown in FIG. 1, 5, 6 or 7.

The sensor 740 may sense the current state of the terminal 200A, such as the open or closed state of the terminal 200A, the location of the terminal 200A, the presence or absence of a user's touch, the orientation of the terminal 200A, or the acceleration/deceleration of the terminal 200A, and may generate a sensing signal to control the operation of the terminal 200A. For example, when the terminal 200A is a slide-type phone, whether the slide-type phone is open or closed may be detected. In addition, the sensor 740 serves to sense whether power is supplied from the power supply 790 or whether the interface 770 is coupled to an external device.

The input/output unit 750 serves to generate visual, audible, or tactile input or output. The input/output unit 750 may generate input data to control the operation of the terminal 200A, and may display information processed in the terminal 200A.

The input/output unit 750 may include a keypad unit 730, a display panel 751, a sound output module 752, and a touchscreen panel 753. The keypad unit 730 may generate input data in response to input to a keypad.

The display panel 751 may include a plurality of pixels, the color of which varies in response to electrical signals. For example, the display panel 751 may include at least one of a liquid crystal display, a thin-film transistor liquid crystal display, an organic light-emitting diode, a flexible display, or a 3D display.

The sound output module 752 may output audio data received from the wireless communication unit 710 in a call-signal reception mode, a call mode, a recording mode, a voice recognition mode, or a broadcast reception mode, or may output audio data stored in the memory 760.

The touchscreen panel 753 may convert variation in capacitance, caused by a user's touch on a specific region of a touchscreen, into electrical input signals.

The memory 760 may store programs for the processing and control of the controller 780, and may temporarily store input/output data (e.g. a phone book, messages, audio, still images, pictures, and moving images). For example, the memory 760 may store images captured by the camera 721, for example, pictures or moving images.

The interface 770 serves as a passage for connection between the terminal 200A and an external device. The interface 770 may receive data or power from the external device, and may transmit the same to respective components inside the terminal 200A, or may transmit data inside the terminal 200A to the external device. For example, the interface 770 may include a wired/wireless headset port, an external charger port, a wired/wireless data port, a memory card port, a port for connection of a device having an identification module, an audio input/output (I/O) port, a video input/output (I/O) port, and an earphone port.

The controller 780 may control the general operation of the terminal 200A. For example, the controller 780 may perform control and processing related to voice calls, data communication, and video calls.

The controller 780 may include a multimedia module 781 for multimedia playback. The multimedia module 781 may be provided inside the controller 780, or may be provided separately from the controller 780.

The controller 780 may perform pattern recognition processing, by which writing or drawing input to the touchscreen is perceived as characters or images.

The power supply 790 may supply power required to operate the respective components upon receiving external power or internal power under the control of the controller 780.

The controller 780 may analyze reflected light received by the sensor 130, and may acquire three-dimensional depth information of an object based on the result of analysis.

The features, structures, effects and the like described above in the embodiments are included in at least one embodiment of the present disclosure, but are not necessarily limited to only one embodiment. Furthermore, the features, structures, effects and the like exemplified in the respective embodiments may be combined with other embodiments or modified by those skilled in the art. Therefore, content related to such combinations and modifications should be construed as falling within the scope of the present disclosure.

INDUSTRIAL APPLICABILITY

The embodiments may be used in a camera module and an optical device including the same that are capable of facilitating a change in the design of a diffusion unit, inhibiting an increase in manufacturing costs attributable to the design change, inhibiting contamination or generation of foreign substances attributable to an SMT process, and inhibiting collision between a gripper of a wire-bonding apparatus and components to protect the components during wire bonding.

The invention claimed is:

1. A camera for measuring depth information, comprising:
a substrate;
a light sensing element and a light emitter comprising a vertical cavity surface emitting laser including a plurality of light-emitting diodes, wherein the light sensing element and the light emitter are disposed on the substrate;
a light receiver comprising a lens barrel and an image sensor;
a case accommodating the light emitter and the light sensing element;
a diffusion unit coupled to the case and disposed on the light emitter;
a printed circuit board coupled to the substrate and the image sensor;
a wire electrically connecting the light emitter to the substrate;
wherein the light sensing element and the lighter emitter are opposite to the diffusion unit in a direction perpendicular to the substrate, and
wherein the light emitter is connected to the substrate by a conductive adhesive member.

2. The camera for measuring depth information according to claim 1, wherein the case accommodates the light receiver.

3. The camera for measuring depth information according to claim 1, wherein the case is coupled to the printed circuit board, and
wherein the diffusion unit is spaced apart from the light emitter.

4. The camera for measuring depth information according to claim 1, wherein the substrate and the image sensor are attached to an upper surface of the printed circuit board.

5. The camera for measuring depth information according to claim 1, wherein the light emitter comprises a sidewall disposed on an upper surface of the substrate and protruding from the substrate toward the diffusion unit, and
wherein the sidewall has therein an opening that is open to one of sides of the upper surface of the substrate.

6. The camera for measuring depth information according to claim 5, wherein the sidewall comprises:
a first sidewall disposed adjacent to a first short side of the substrate; and
a second sidewall disposed adjacent to a second short side of the substrate, the second short side being located opposite the first short side, and
wherein the opening in the sidewall is open to a first long side of the substrate, the first long side being located between the first short side and the second short side.

7. The camera for measuring depth information according to claim 5, wherein a height from the upper surface of the substrate to an upper end of the sidewall is greater than a height to a upper surface of the light-emitting diode.

8. The camera for measuring depth information according to claim 1, wherein the diffusion unit is a zoom lens or a liquid lens.

9. The camera for measuring depth information according to claim 1, wherein the light sensing element is a photodiode disposed on the substrate, and the photodiode is configured to sense light generated from the light-emitting diode.

10. The camera for measuring depth information according to claim 1, wherein a thickness of the substrate is greater than a thickness of the image sensor.

11. The camera for measuring depth information according to claim 1, wherein the lens barrel is coupled to the case and the image sensor is disposed under the lens barrel.

12. The camera for measuring depth information according to claim 8, wherein the diffusion unit is configured to convert a field of view of light radiated from the light emitter.

13. The camera for measuring depth information according to claim 1, wherein the light sensing element and the lighter emitter overlap the diffusion unit in the direction perpendicular to the substrate.

14. A camera, comprising:
a light emitter comprising a substrate and a light-emitting diode disposed on the substrate;
a light receiver comprising a lens barrel and a sensor;
a case accommodating the light emitter;
a diffusion unit coupled to the case and disposed on the light emitter; and
a printed circuit board coupled to the substrate and the sensor,
wherein the light emitter comprises a sidewall disposed on an upper surface of the substrate and protruding from the substrate toward the diffusion unit,
wherein the light sensing element and the lighter emitter are opposite to the diffusion unit in a direction perpendicular to the substrate, and
wherein the light emitter is connected to the substrate by a conductive adhesive member.

15. The camera for measuring depth information according to claim 14, wherein the sidewall has an opening that is open to one of sides of the upper surface of the substrate.

16. The camera for measuring depth information according to claim 14, wherein the light sensing element and the lighter emitter overlap the diffusion unit in the direction perpendicular to the substrate.

17. The camera for measuring depth information according to claim 14, wherein the light sensing element is a photodiode configured to sense light generated from the light-emitting diode.

18. A camera for measuring depth information, comprising:
a circuit board;
a substrate disposed on the circuit board;
a light sensing element and a light emitter disposed on the substrate;
a conductive adhesive member disposed between the substrate and the light emitter;
an image sensor disposed on the circuit board;
a case disposed on the circuit board and accommodating the substrate and the light emitter; and
a diffusion unit disposed on the case and configured to convert a field of view of light radiated from the light emitter,
wherein the substrate is AlN substrate and comprises a first terminal and a second terminal,
wherein the light emitter is a vertical cavity surface emitting laser including a plurality of infrared light-emitting diodes,
wherein the light emitter comprises a first electrode and a second electrode,
wherein the first electrode is connected to the first terminal of the substrate by a wire, and the second electrode is connected to the second terminal of the substrate by the conductive adhesive member, and
wherein the light sensing element and the lighter emitter are opposite to the diffusion unit in a direction perpendicular to the substrate.

19. The camera for measuring depth information according to claim 18, wherein the light sensing element and the lighter emitter overlap the diffusion unit in the direction perpendicular to the substrate.

20. The camera for measuring depth information according to claim 18, wherein the light sensing element is a photodiode configured to sense light generated from the light-emitting diode.

* * * * *